United States Patent
Nakamura

[19]

[11] Patent Number: 6,118,325
[45] Date of Patent: Sep. 12, 2000

[54] SEMICONDUCTOR DEVICE CAPABLE OF PREVENTING RINGING OF OUTPUT WAVEFORM

[75] Inventor: Yayoi Nakamura, Hyogo, Japan

[73] Assignee: Mitsubishi Denki Kabushiki Kaisha, Tokyo, Japan

[21] Appl. No.: 09/116,243

[22] Filed: Jul. 16, 1998

[30] Foreign Application Priority Data

Jan. 26, 1998 [JP] Japan ................................. 10-012789

[51] Int. Cl.[7] .................................................... H03K 17/16

[52] U.S. Cl. ...................... 327/384; 327/374; 327/404; 327/427; 326/87; 326/88; 326/27

[58] Field of Search ................................. 327/362, 374, 327/376, 427, 434, 404, 403, 384, 389, 108, 112, 111; 326/80, 83, 87, 88, 86, 26, 27

[56] References Cited

U.S. PATENT DOCUMENTS

| | | | |
|---|---|---|---|
| 5,391,939 | 2/1995 | Nonaka | 326/26 |
| 5,489,859 | 2/1996 | Kawaguchi et al. | 326/87 |
| 5,760,621 | 6/1998 | Keeth | 326/87 |
| 5,877,647 | 3/1999 | Vajapey et al. | 327/384 |

FOREIGN PATENT DOCUMENTS 5-290582  11/1993  Japan .

*Primary Examiner*—Jung Ho Kim
*Attorney, Agent, or Firm*—McDermott, Will & Emery

[57] ABSTRACT

A plurality of output transistors for an output buffer of a semiconductor device are provided in parallel. Potentials to be applied to gates of output transistors are set to different levels upon conduction of the output transistors. By sequentially rendering the transistors conductive in the order of increasing voltage during conduction, rapid flow of a large amount of current is prevented, thereby reducing ringing. More preferably, the transistors are increased in size according to the order of conduction of the output transistors.

9 Claims, 11 Drawing Sheets

SEMICONDUCTOR DEVICE CAPABLE OF PREVENTING RINGING OF OUTPUT WAVEFORM

BACKGROUND OF THE INVENTION

1. Field of the Invention

The present invention relates to semiconductor devices, and more specifically to a semiconductor device with an output buffer circuit externally outputting data within the semiconductor device.

2. Description of the Background Art

With the recent increase in speed of semiconductor devices, increasingly higher drivability is required for output buffer circuits in semiconductor devices.

FIG. 11 is a first exemplary circuit diagram showing a basic arrangement of an output buffer circuit used in a conventional semiconductor memory device.

The output buffer circuit shown in FIG. 11 includes:

an output terminal DQr; a level shifter 206 receiving a first internal control signal HOUT generated in accordance with stored data to be output for shifting its H level from an internal down-converted potential Vcc down-converted from an external power supply potential Ext.Vcc to an internal boosted potential Vppo internally generated within the semiconductor device; an N channel MOS transistor 202 having its gate receiving an output from level shifter 206 and connected between external power supply potential Ext.Vcc and output terminal DQr; and an N channel MOS transistor 204 having its gate receiving a second internal control signal LOUT generated in accordance with stored data to be output and connected between output terminal DQr and a ground potential.

FIG. 12 is a diagram of operation waveforms shown in conjunction with the operation of the output buffer circuit in FIG. 11.

Referring to FIGS. 11 and 12, internal control signal HOUT rises to the H level at t1. At the time, assume that internal control signal LOUT, not shown in FIG. 12, is at an L level and N channel MOS transistor 204 is in a non-conductive state.

Operation of level shifter 206 allows a node N51, which is an output node of level shifter 206, to rise to the H level. Then, N channel MOS transistor 202 becomes conductive and the potential at output terminal DQr begins to rise.

Here, due to the state of a load connected to output terminal DQr outside the semiconductor device, ringing of the waveform may be caused for the signal to be output from output terminal DQr.

At t3, the potential of the signal to be output from output terminal DQr is stabilized.

The ringing may disadvantageously cause malfunction of other semiconductor devices or the like externally connected for receiving the output signal.

An improved output buffer circuit has been proposed in Japanese Patent Laying-Open No. 5-290582 as a circuit capable of reducing power supply noise during such output of signals. The output buffer circuit is used, for example, for driving a word line for the semiconductor memory device.

FIG. 13 is a circuit diagram showing an arrangement of a conventional output buffer circuit in the aforementioned laid open application.

Referring to FIG. 13, the output buffer circuit includes: an inverter 231 receiving and inverting an input signal S for outputting the inverted signal thereof to a node N131; an N channel MOS transistor 241 having its gate connected to node N131 and connecting a power supply potential Vcc and an output terminal OUT; a delay circuit 232 receiving and delaying the output signal from inverter 231; a bootstrap circuit 233 receiving an output from delay circuit 232; and an N channel MOS transistor 242 having its gate connected node N133 and connecting power supply potential Vcc and output terminal OUT.

The output buffer circuit further includes an inverter 243 receiving and inverting an input signal R, and an N channel MOS transistor 244 having its gate receiving an output from inverter 243 and connecting a ground potential Vss and output terminal OUT.

Delay circuit 232 includes series connected inverters 232a and 232b.

FIG. 14 is a circuit diagram showing an arrangement of bootstrap circuit 233 shown in FIG. 13.

Referring to FIG. 14, bootstrap circuit 233 includes an inverter 211 receiving an input signal at an input node N110, and an inverter 212 receiving and inverting an output from inverter 211.

Outputs from inverters 211 and 212 are applied to nodes N111 and N112, respectively.

Bootstrap circuit 233 further includes: an N channel MOS transistor 213 having its gate receiving a power supply potential Vcc and connecting nodes N111 and N113; an N channel MOS transistor 214 having its gate receiving the potential of node N113 and connecting nodes N110 and N133; and a capacitor 215 connected between nodes N112 and N113.

Referring to FIGS. 13 and 14, given that input signal R is at H level and N channel MOS transistor 244 is in the non-conductive state, when input signal S falls from H to L level, the potential of node N131 first rises from L to H level by inverter 231.

Responsively, N channel MOS transistor 241 becomes conductive, so that the potential at output terminal OUT begins to rise from L to H level.

Thereafter, input node N110 for bootstrap circuit 233 rises from L to H level after a period of time delayed by delay circuit 232. Responsively, bootstrap circuit 233 shifts the potential of node N133 higher than power supply potential Vcc. Then, N channel MOS transistor 242 becomes sufficiently conductive, so that power supply potential Vcc is transmitted to output terminal OUT.

As described above, by sequentially rendering two output transistors in the output buffer circuit conductive, H level is gradually supplied for the output terminal, so that a large amount of current cannot flow into the output terminal from the node receiving power supply potential Vcc at a time. Thus, reduction in power supply noise is achieved.

Furthermore, when an input pulse in an impulse form is introduced to input signal S, electric charge may pass from node N133 to node N110 for bootstrap circuit 233. Though N channel MOS transistor 241 allows output terminal OUT to maintain H level, N channel MOS transistor 242 cannot maintain the stabilized conductive state due to decrease in the potential of node N133.

As described above, for the output buffer shown in FIG. 11, when the output transistor is increased in size to achieve higher drivability for the output buffer circuit due to a demand in speed, current rapidly flows from the output buffer circuit in the semiconductor device to the external load connected to the output terminal, thereby causing ringing.

On the other hand, the circuit described with reference to FIGS. 13 and 14 applies a gate potential of the output transistor using the bootstrap circuit. The output terminal however cannot maintain the level of power supply potential Vcc as H level for a long period of time as bootstrap circuit generates a high potential only for a given period of time.

In the generally used semiconductor device, load for the output buffer externally outputting a signal from the semiconductor device depends on the type of the externally connected circuit board and element, so that a constant rising time is not obtained for the output signal.

In addition, a semiconductor device with high operation frequency may be used for the application with low operation frequency.

Thus, the circuit shown in FIG. 13 may not suitably be used as an output buffer for outputting a signal to the outside the semiconductor device.

SUMMARY OF THE INVENTION

An object of the present invention is to provide a semiconductor device capable of reducing ringing appearing on an output signal caused upon outputting a signal to the outside the semiconductor device from an output terminal.

Briefly summarized, the present invention is a semiconductor device formed on a semiconductor substrate and including an output terminal, a first MOS transistor, a first driving circuit and a second MOS transistor.

The first MOS transistor supplies current for the output terminal from an external power supply in response to activation of a first internal control signal. The first driving circuit outputs a second internal control signal in response to activation of the first internal control signal. The second MOS transistor receives the second internal control signal at its gate and supplies current for the output terminal from the external power supply in response to activation of the second internal control signal. The second internal control signal has an activation potential which is higher than that of the first internal control signal.

Therefore, a main advantage of the present invention is to prevent a large amount of current from flowing into the output terminal from an output buffer of the semiconductor device and reduce ringing by gradually shifting the potential at the output terminal from L to H level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
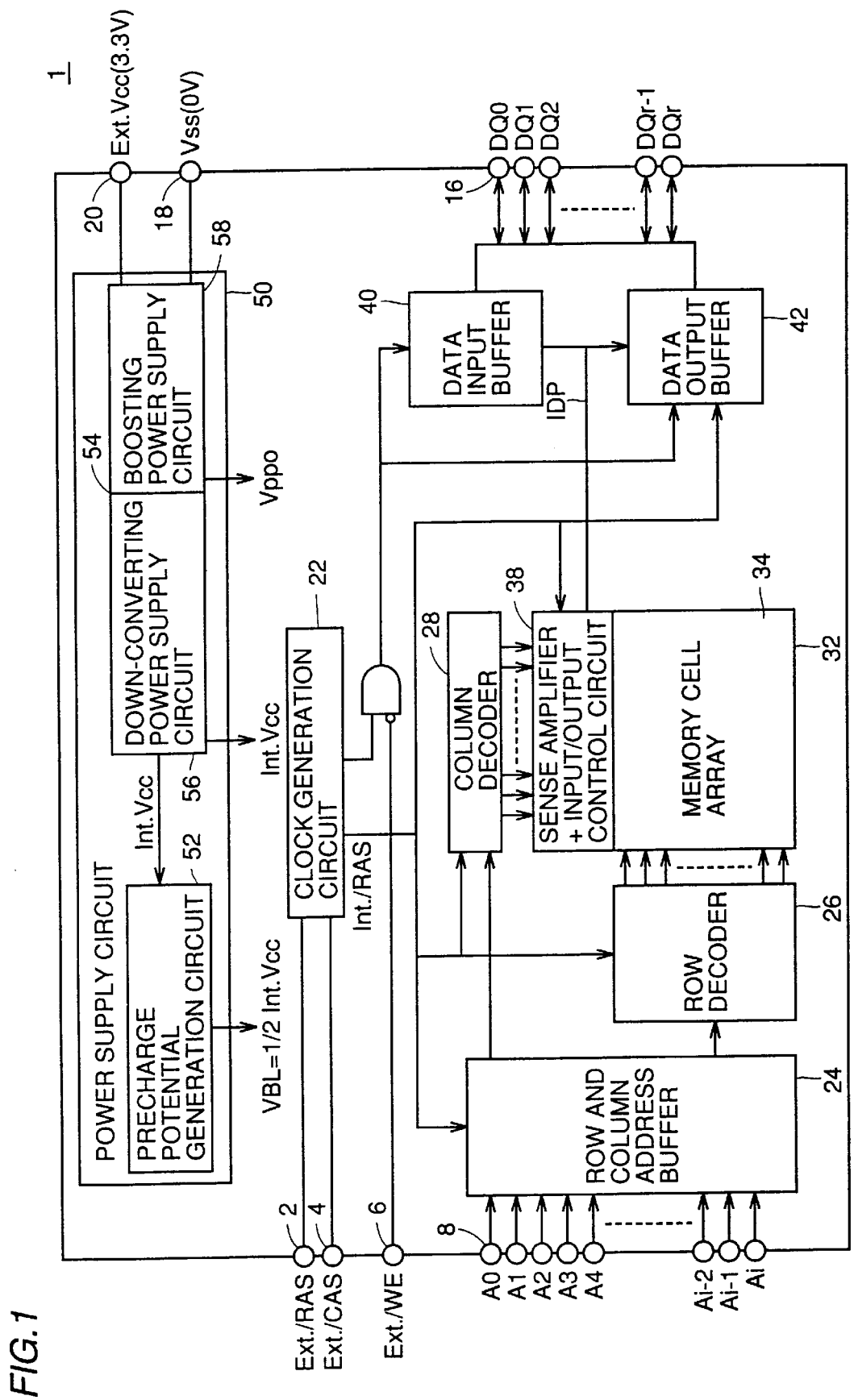
FIG. 1 is a schematic block diagram showing an overall arrangement of a semiconductor device 1 in accordance with a first embodiment of the present invention.

Embodiments of the present invention will now be described in detail with reference to the drawings. It is noted that the same reference characters in the drawings indicate the same or corresponding portions.

First Embodiment

A semiconductor device 1 in accordance with a first embodiment of the present invention will be now be described.

An overall arrangement of semiconductor device 1 of the present invention is shown in FIG. 1 as being a typical example applicable to every embodiment which will be hereinafter described.

Referring to FIG. 1, semiconductor memory device 1 includes control signal input terminals 2 to 6, a group of address signal input terminals 8, a group of data signal input/output terminals 16, a ground terminal 18 and a power supply terminal 20.

Semiconductor memory device 1 further includes a clock generation circuit 22, a row and column address buffer 24, a row decoder 26, a column decoder 28, a memory mat 32, and data input and output buffers 40 and 42. Memory mat 32 includes a memory cell array 34 and a sense amplifier+input/output control circuit 38.

Clock generation circuit 22 generates a control clock corresponding to a prescribed operation mode in accordance with an external row address strobe signal EXT./RAS and an external column address strobe signal EXT./CAS, which are externally applied through control signal input terminals 2 and 4, for controlling the whole operation of the semiconductor device.

Row and column address buffer 24 generates row address signals RA0 to RAi and column address signals CA0 to CAi in accordance with address signals A0 to Ai (where i is a natural number) externally applied through the group of address signal input terminals 8, and applies the generated signals RA0 to RAi and CA0 to CAi to row and column decoders 26 and 28, respectively.

Memory cell array 34 includes a plurality of memory cells each storing 1-bit data. Each of the memory cells are arranged in a prescribed address determined by row and column addresses.

Row and column decoders 26 and 28 designate row and column addresses for memory cell array 34. Sense amplifier+input/output control circuit 38 connects the memory cell in the address designated by row and column decoders 26 and 28 to one end of a pair of data signal input/output lines IDP. The other end of the pair of data signal input/output lines IDP is connected to data input and output buffers 40 and 42.

During writing mode, data input buffer 40 is responsive to a signal EXT./WE externally applied through control signal input terminal 6 for applying data input from the group of data signal input terminals 16 to the selected memory cell through the pair of data signal input/output lines IDP.

During reading mode, data output buffer 42 outputs read data from the selected memory cell to the group of data input/output terminals 16.

A power supply circuit 50 receives an external power supply potential Ext.Vcc and a ground potential Vss for supplying different internal power supply potentials required for the operation of the semiconductor memory device.

More specifically, power supply circuit 50 includes: an internal power supply circuit 54 receiving external power supply potential Ext.Vcc and ground potential Vss for outputting an internal down-converted potential Int.Vcc and an internal boosted potential Vppo; and a precharge potential generation circuit 52 supplying a precharge potential VBL for a pair of bit lines included in memory cell array 34.

Internal power supply circuit 54 includes: a down-converting power supply circuit 56 receiving external power supply potential Ext.Vcc and the ground potential Vss for generating internal down-converted potential Int.Vcc down-converted from external power supply potential Ext.Vcc; and a boosting power supply circuit 58 receiving external power supply potential Ext.Vcc and ground potential Vss for generating an internal boosted potential Vppo boosted from external-power supply potential Ext.Vcc.

Figure 2:
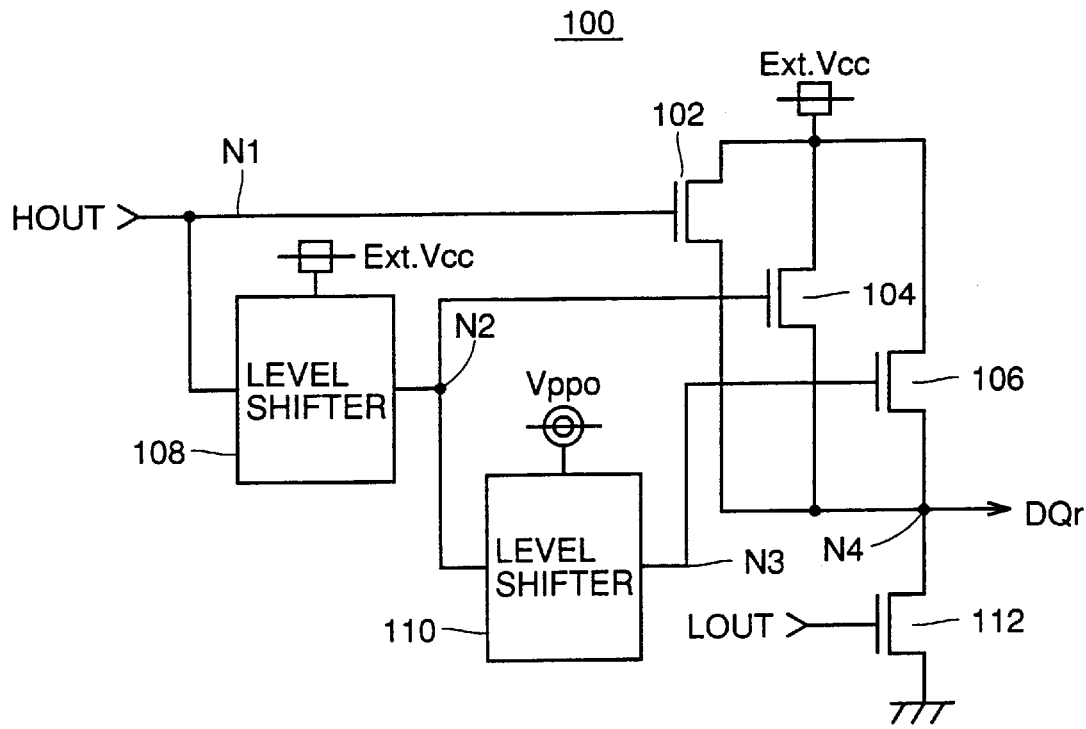
FIG. 2 is a circuit diagram showing an output buffer circuit 100 in accordance with the first embodiment of the present invention.

FIG. 2 is a circuit diagram showing a basic arrangement of an output buffer circuit 100 used in semiconductor device 1 in accordance with the first embodiment of the present invention.

Output buffer circuit 100 corresponds to 1 bit of output buffer 42 shown in FIG. 1, and receives mutually complementary first and second internal signals HOUT and LOUT as input signals, which are generated in accordance with the above mentioned signal from clock generation circuit 22 or read data from input/output control circuit 38.

Referring to FIG. 2, output buffer circuit 100 includes: an N channel MOS transistor 102 receiving first internal control signal HOUT at its gate and connecting an output terminal DQr and external power supply potential Ext.Vcc; a level shifter 108 receiving and level-shifting first internal control signal HOUT in accordance with external power supply potential Ext. Vcc; a level shifter 110 receiving and level shifting an output from level shifter 108 in accordance with internal boosted potential Vppo; an N channel MOS transistor 104 receiving the output from level shifter 108 at its gate and connecting output terminal DQr and external power supply potential Ext.Vcc; an N channel MOS transistor 106 receiving an output from level shifter 110 at its gate and connecting output terminal DQr and external power supply potential Ext.Vcc; and an N channel MOS transistor 112 receiving second internal control signal LOUT at its gate and connecting output terminal DQr and the ground potential.

Figure 3:
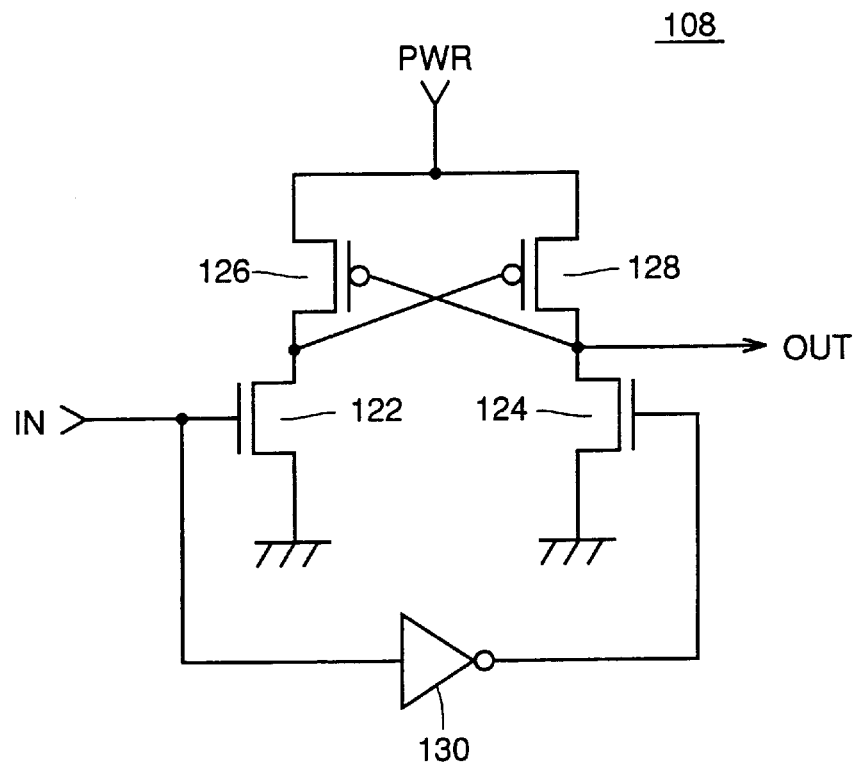
FIG. 3 is a circuit diagram showing an arrangement of a level shifter 108 shown in FIG. 2.

Referring to FIG. 3, level shifter 108 includes: an N channel MOS transistor 122 having its gate receiving an input signal IN and its source connected to the ground potential; an inverter 130 receiving and inverting input signal IN; an N channel MOS transistor 124 having its gate receiving an output from inverter 130 and its source connected to the ground potential; a P channel MOS transistor 126 having its gate receiving the potential of the drain of N channel MOS transistor 124 and its drain connected to the drain of N channel MOS transistor 122; and a P channel MOS transistor 128 having its gate receiving the potential of the drain of N channel MOS transistor 122 and its drain connected to the drain of N channel MOS transistor 124.

Sources of P channel MOS transistors 126 and 128 are both connected to a power supply node PWR.

The potential of the drain of N channel MOS transistor 124 outputs an output signal OUT from level shifter 108.

Referring to FIG. 2, level shifter 108 has its power supply node PWR provided with external power supply potential Ext.Vcc. Then, internal control signal HOUT is level-shifted from high (H) to external power supply potential Ext.Vcc for output.

Level shifter 110 also assumes a similar arrangement as that for level shifter 108 shown in FIG. 3. A high potential level of the output signal from level shifter 108, that is external power supply potential Ext.Vcc, is shifted to internal boosted potential Vppo.

In the semiconductor device in accordance with the first embodiment, the output buffer is provided with a plurality of transistors in parallel, as shown in FIG. 2, for driving the H side of the output buffer circuit externally transmitting its internal data.

Figure 4:
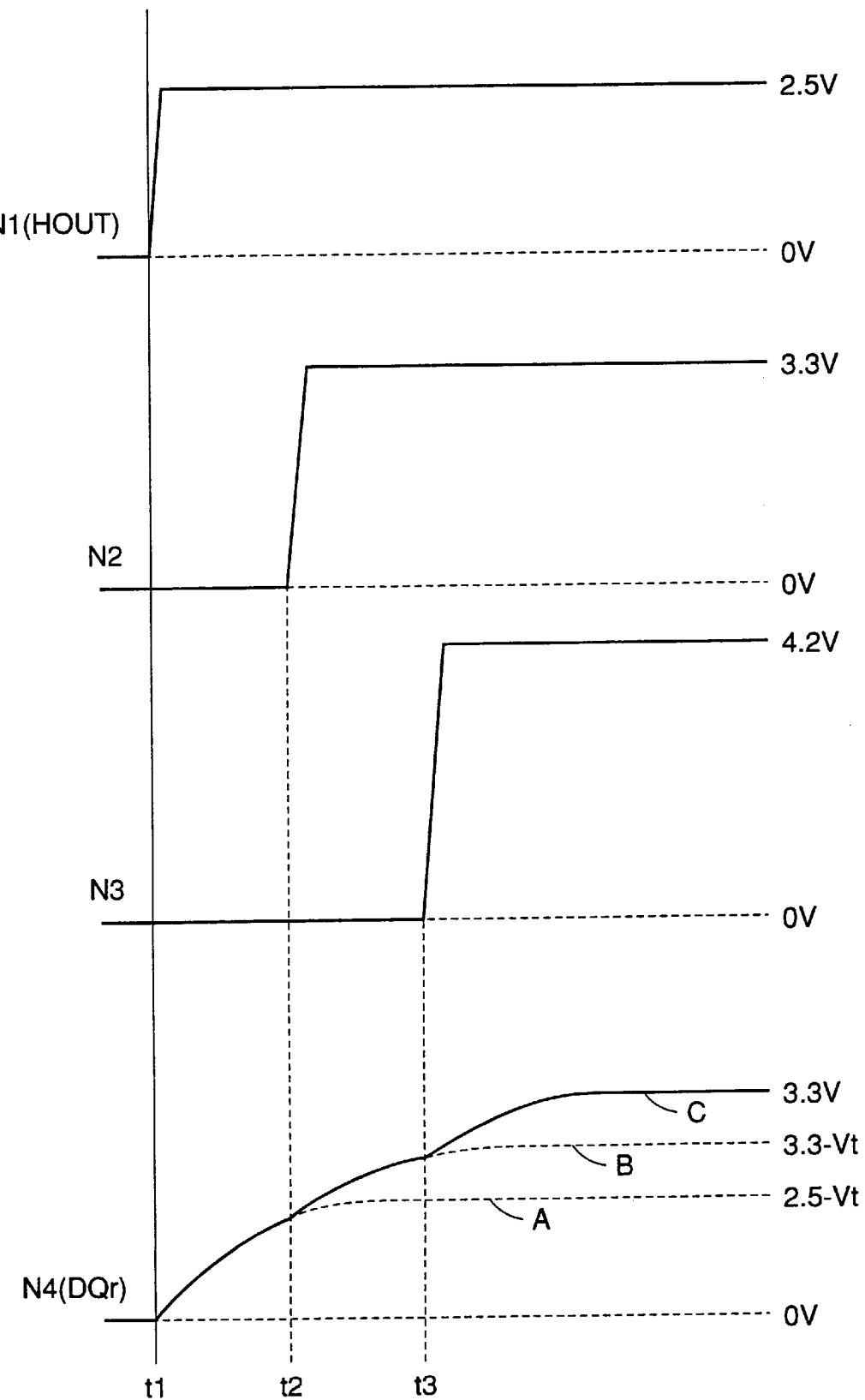
FIG. 4 is a diagram of operation waveforms shown in conjunction with the operation of output buffer 100 in FIG. 2.

Referring to FIGS. 2 and 4, the case where second internal control signal LOUT is in an L state will now be considered. Then, N channel MOS transistor 112 is in a non-conductive state.

Assuming that the level at output terminal DQr is initially 0V, first internal control signal HOUT is at L level and the potentials of nodes N2 and N3, which are the outputs from level shifters 108 and 110 are also at L level so that N channel MOS transistors 102, 104 and 106 are all in the non-conductive state.

At t1, when first internal control signal HOUT applied to node N1 rises from 0V to internal down-converted potential Vcc (for example of 2.5V), responsively, N channel MOS transistor 102 is brought into the conductive state. As is apparent from a waveform A in FIG. 4, the potential at output terminal DQr begins to rise toward the potential of (2.5V-Vt). It is noted that Vt is a threshold voltage of the N channel MOS transistor.

Between t1 and t2, first internal control signal HOUT is level-shifted by level shifter 108. In FIG. 3, N channel MOS transistor 122 is brought into the conductive state and a gate potential of P channel MOS transistor 128 is activated to L level. On the other hand, N channel MOS transistor 124 is brought into the non-conductive state, as H level, which is the inversion of first internal control signal HOUT, is applied to its gate by inverter 130. An output from level shifter 108 attains to the applied external power supply potential Ext.Vcc.

At t2, voltage conversion by level shifter 108 is completed and N channel MOS transistor 104 is brought into the conductive state. As is apparent from a waveform B in FIG. 4, the potential of DQr begins to rise toward the potential of (3.3V-Vt).

Between t2 and t3, first internal control signal HOUT is level-shifted by level shifter 110. As in the case for level shifter 108, the output from level shifter 110 attains to the applied external power supply potential Ext.Vcc.

At t3, voltage conversion by level shifter 110 is completed and N channel MOS transistor 106 is brought into the conductive state. As is apparent from a waveform C in FIG. 4, the potential at DQr begins to rise toward external power supply potential Ext.Vcc (of 3.3V).

Briefly summarized, the voltages applied to the gates of the transistors as H level increase in the order of N channel MOS transistors 102, 104 and 106.

In other words, N channel MOS transistor 102 has its gate supplied with internal control signal HOUT, whose H level equals to internal power supply potential Int.Vcc.

N channel MOS transistor 104 has its gate supplied with a signal whose H level equals to external power supply potential Ext.Vcc by level shifter 108. N channel MOS transistor 106 has its gate supplied with a signal whose H level equals to internal boosted potential Vppo. These three transistors become conductive in the order of increasing voltage applied to their respective gates due to the delay caused by level shifters 108 and 110.

More specifically, the transistors become conductive in the order of 102, 104 and 106.

When internal control signal HOUT rises from L to H level, N channel MOS transistor 102 firstly becomes conductive, and subsequently, N channel MOS transistor 104 becomes conductive after a period of time delayed by level shifter 108. Further, N channel MOS transistor 106 becomes conductive after a period of time delayed by level shifter 110.

Thus, by making the output transistors conductive in the order of increasing voltage applied to their respective gates for gradually increasing the potential at the output terminal to H level, a large amount of current is prevented from flowing to the output terminal from the external power supply, whereby reduction in ringing is achieved.

While three output transistors are connected in parallel in FIG. 2, a similar effect can also be obtained using four or more output transistors.

Second Embodiment

Figure 5:
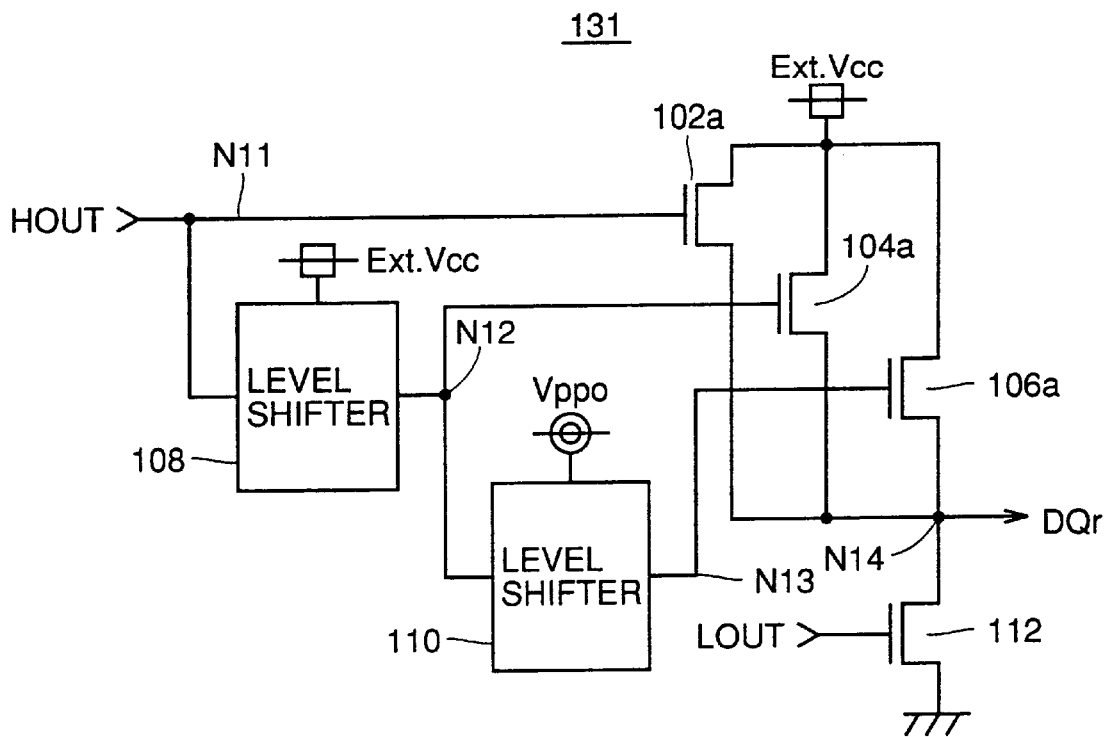
FIG. 5 is a circuit diagram showing an arrangement of an output buffer circuit 131 used in a semiconductor device in accordance with a second embodiment.

Referring to FIG. 5, as a modification of the first embodiment, an output buffer circuit 131 includes N channel MOS transistors 102a, 104a and 106a in place of N channel MOS transistors 102, 104 and 106 as output transistors.

Given that current drivability is defined as an amount of change in source/drain current per unit change in a gate potential, N channel MOS transistor 102a has current drivability which is lower than that for N channel MOS transistors 104a and 106a.

More specifically, current drivability is proportional to a value obtained by dividing a gate width of the MOS transistor by a gate length (gate width/gate length). Therefore, if the gate lengths for N channel MOS transistors 102a, 104a and 106a are constant and the gate widths are W2, W4 and W6, respectively, then W2<W4<W6.

If the gate widths are thus set, rapid flow of current can be more effectively prevented at the rising of the waveform when the output buffer circuit outputs an H output, as compared with the first embodiment. As a result, further reduction in ringing is achieved.

Figure 6:
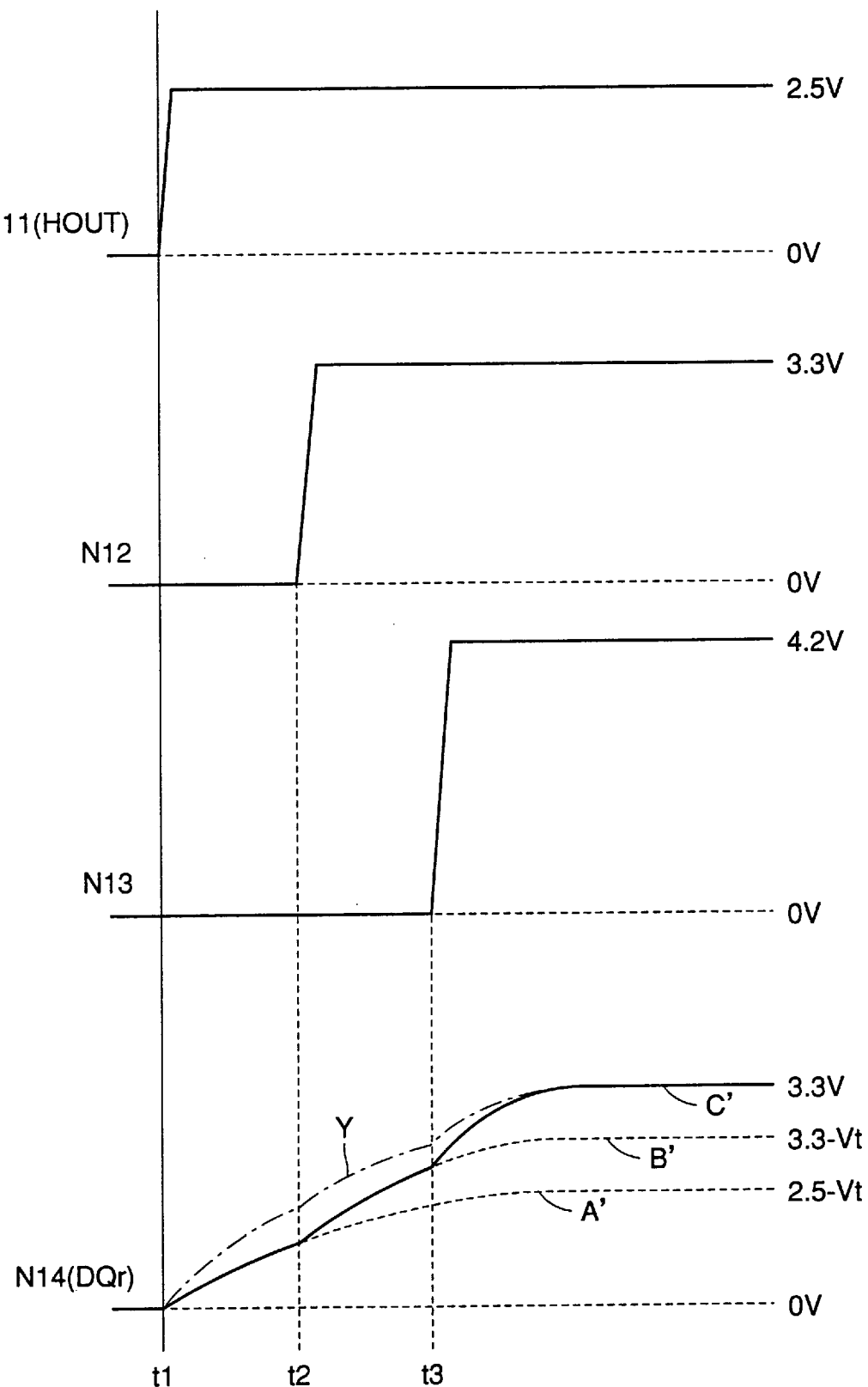
FIG. 6 is a diagram of operation waveforms shown in conjunction with the operation of output buffer 131 in FIG. 5.

Referring now to FIGS. 5 and 6, the case where second internal control signal LOUT is in the L state is considered. At the time, N channel MOS transistor 112 is in the non-conductive state.

Assuming that the level at output terminal DQr is initially 0V, first internal control signal HOUT is at L level and the potentials of nodes N12 and N13, which are the outputs from level shifters 108 and 110, are also at L level, so that N channel MOS transistors 102a, 104a and 106a are all in the non-conductive state.

At time t1, when first internal control signal HOUT, which is applied to node N11, rises from 0V to internal down-converted potential Vcc (for example of 2.5V), responsively, N channel MOS transistor 102a is brought into the conductive state. As is apparent from a waveform A' in FIG. 6, the potential at DQr begins to rise toward the potential of (2.5V-Vt). It is noted that Vt is a threshold voltage of the N channel MOS transistor.

Between t1 and t2, first internal control signal HOUT is level-shifted by level-shifter 108 and attains to external power supply potential Ext.Vcc, to which its H level is applied.

At t2, voltage conversion by level shifter 108 is completed and N channel MOS transistor 104a is brought into the conductive state. As is apparent from a waveform B' in FIG. 6, the potential at output terminal DQr begins to rise toward the potential of (3.3V-Vt).

Between t2 and t3, first internal control signal HOUT is level-shifted by level shifter 110 and the potential of node N13 attains to internal boosted potential Vppo, to which its H level is applied.

At t3, voltage conversion by level shifter 110 is completed and N channel MOS transistor 106 is brought into the conductive state. As is apparent from a waveform C' in FIG. 6, the potential at DQr begins to rise toward external power supply potential Ext.Vcc (of 3.3V).

A waveform Y in FIG. 6 shows the output waveform from output buffer circuit 100 shown in FIG. 2. For output buffer 131 shown in FIG. 5, rising of the waveform is relatively slow between t1 and t2 as compared with waveform Y, but becomes rapid between t2 and t3.

Therefore, a larger transistor is used for supplying current such that the peak value of the amount of change in current is decreased at time t1, when the amount of change in current flowing into the output terminal is the largest, and that the amount of current reduced between t1 and t2 can be compensated between time t2 and t3.

Thus, output buffer circuit 131 used in the semiconductor device in accordance with the second embodiment is provided with an enhanced output characteristics allowing shorter rising time for the potential at the output terminal while reducing the amount of change in current, which is a major cause of ringing.

Third Embodiment

A third embodiment of the present invention differs from the first embodiment in that the input of level shifter 140 applying the gate potential of N channel MOS transistor 136 is supplied by a delay circuit 144 receiving internal control signal HOUT.

Figure 8:
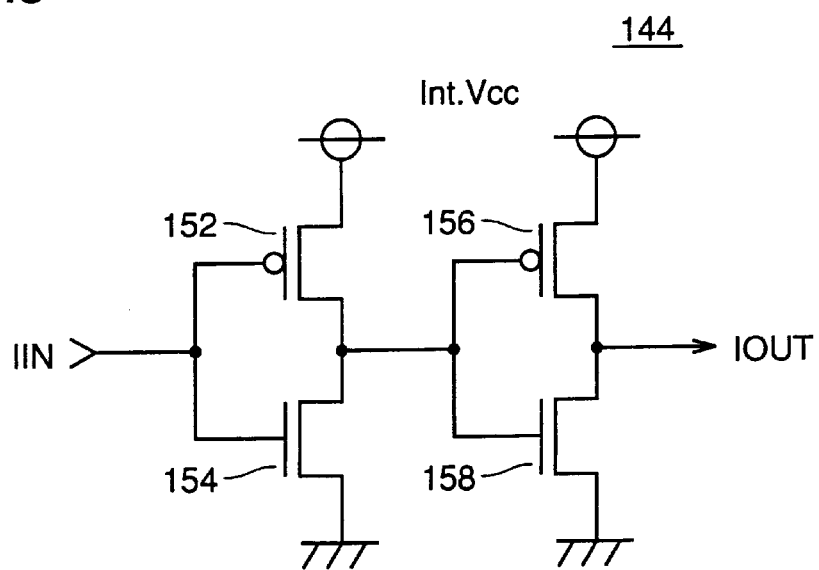
FIG. 8 is a circuit diagram showing an arrangement of a delay circuit 144 shown in FIG. 7.

Referring to FIG. 8, delay circuit 144 includes: an N channel MOS transistor 154 having its gate receiving an input signal IIN and its source connected to a ground potential; a P channel MOS transistor 152 having its gate receiving input signal IIN, its source connected to internal power supply potential Int.Vcc and its drain connected to the drain of N channel MOS transistor 154; an N channel MOS transistor 158 having its gate receiving the potential of the drain of N channel MOS transistor 154 and its source connected to the ground potential; and a P channel MOS transistor 156 having its gate receiving the potential of the drain of N channel MOS transistor 154, its source connected to internal power supply potential Int.Vcc and its drain connected to the drain of N channel MOS transistor 158.

The potential of the drain of N channel MOS transistor 158 applies an output signal IOUT from delay circuit 144.

External power supply potential Ext.Vcc often changes its level due to noise from a power supply line, which applies the external power supply potential to the semiconductor device. Meanwhile, internal power supply potential Int.Vcc or internal boosted potential vppo is generated within the semiconductor device and stabilized, maintaining a relatively stabilized potential.

In the arrangements shown in FIGS. 2 and 5, level shifter 108 receiving external power supply potential Ext.Vcc as the power supply potential shifts internal control signal HOUT, and the operation of level shifter 110 receiving an output signal from level shifter 108 determines the timing at which N channel MOS transistor 106 for the output transistor becomes conductive. In this arrangement, when external power supply potential Ext.Vcc changes, the timing at which N channel MOS transistor 106 becomes conductive is subject to change.

Figure 7:
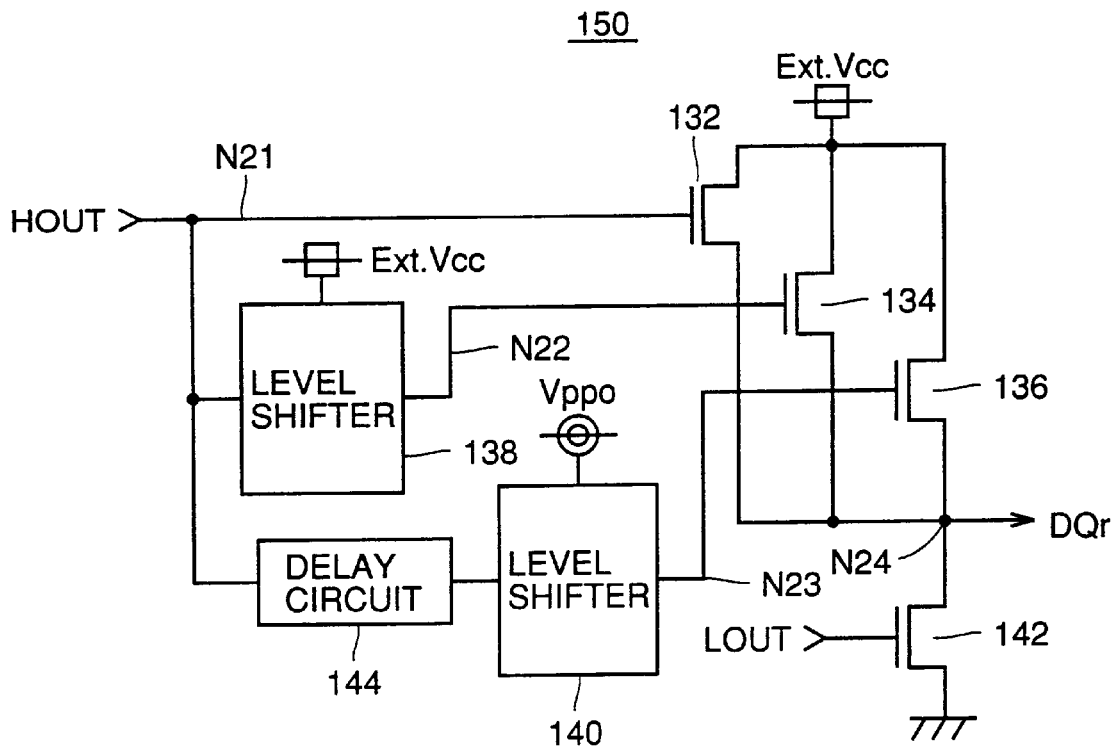
FIG. 7 is a circuit diagram showing an arrangement of an output buffer circuit 150 used in a semiconductor device in accordance with a third embodiment.

With the arrangement shown in FIG. 7, the timing at which each transistor becomes conductive does not change even when external power supply potential Ext.Vcc changes to some extent, so that the output waveform output from output terminal DQr is stabilized.

In FIG. 7, delay circuit 144 is connected in front of level shifter 140. However, the delay circuit may also be provided between the output signal from level shifter 140 and a gate of N channel MOS transistor 136 to achieve a similar effect.

Fourth Embodiment

Figure 9:
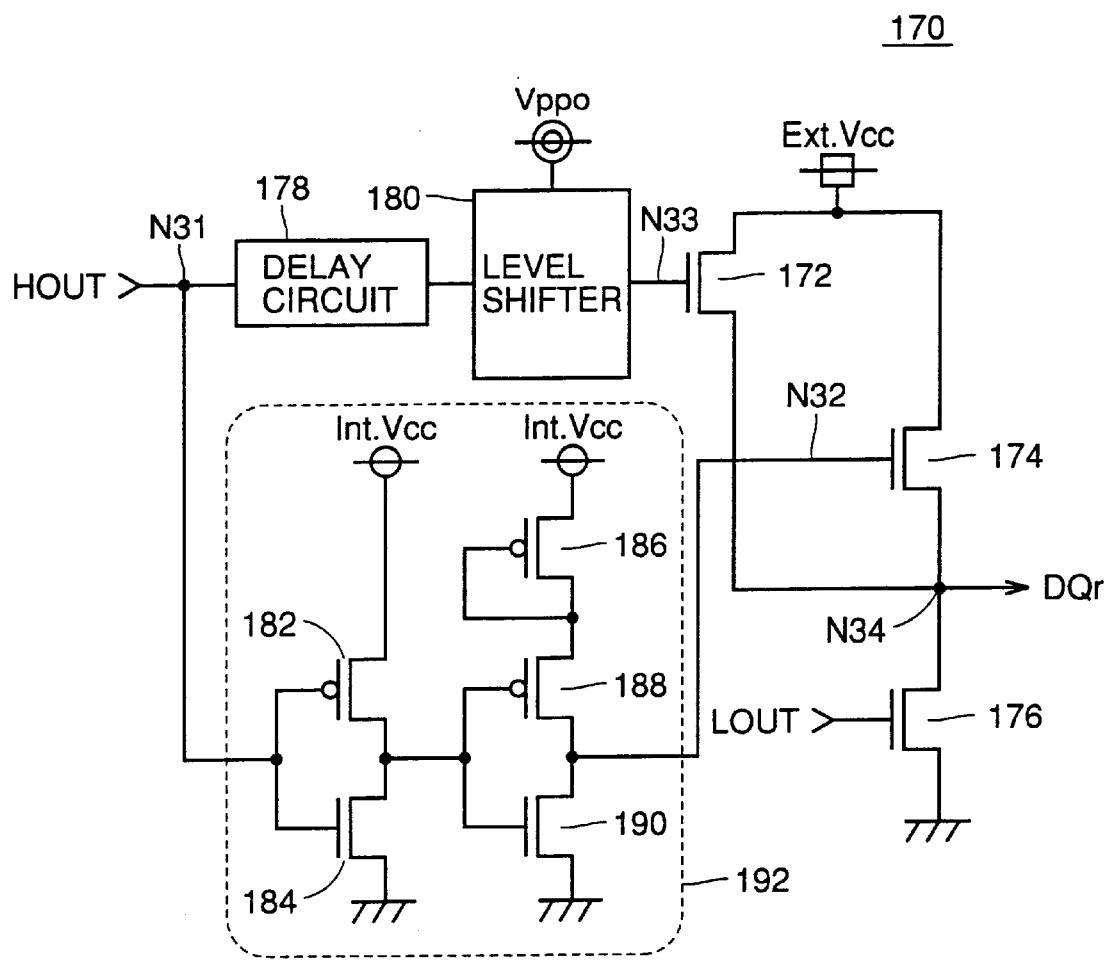
FIG. 9 is a circuit diagram showing an arrangement of an output buffer circuit 170 used in a semiconductor device in accordance with a fourth embodiment.

Referring to FIG. 9, an output buffer circuit 170 includes: a delay circuit 178 receiving first internal control signal HOUT; a level shifter 180 receiving and level-shifting an output from delay circuit 178 in accordance with an internal boosted potential Vppo; an N channel MOS transistor 172 having its gate receiving an output from level shifter 180 and connecting an output terminal DQr and an external power supply potential Ext.Vcc; a driving circuit 192 receiving first internal control signal HOUT; an N channel MOS transistor 174 receiving an output from driving circuit 192 and connecting external power supply potential Ext.Vcc and output terminal DQr; and an N channel MOS transistor 176 having its gate receiving a second internal control signal LOUT and connecting a ground potential and output terminal DQr.

Driving circuit 192 includes: an N channel MOS transistor 184 having its gate receiving first internal control signal HOUT and its source connected to the ground potential; a P channel MOS transistor 182 having its source connected to internal power supply potential Int.Vcc and its drain connected to the drain of N channel MOS transistor 184; an N channel MOS transistor 190 having its gate receiving the potential of the drain of N channel MOS transistor 184 and having its source connected to the ground potential; a P channel MOS transistor 188 having its gate receiving the potential of the drain of N channel MOS transistor 184 and its drain connected to the drain of N channel MOS transistor 190; and a P channel MOS transistor 186 having its gate and drain connected to the source of P channel MOS transistor 188 and its source connected to internal power supply potential Int.Vcc.

As delay circuit 178 and level shifter 180 have arrangements similar to those for delay circuit 144 in FIG. 8 and level shifter 108 in FIG. 3, respectively, the description thereof will not be repeated here.

In the fourth embodiment, the potential applied to the gate of N channel MOS transistor 174, which becomes conductive first among driving transistors on the H side, is down-converted from internal power supply potential Int.Vcc by the threshold voltage of P channel MOS transistor 186.

Figure 10:
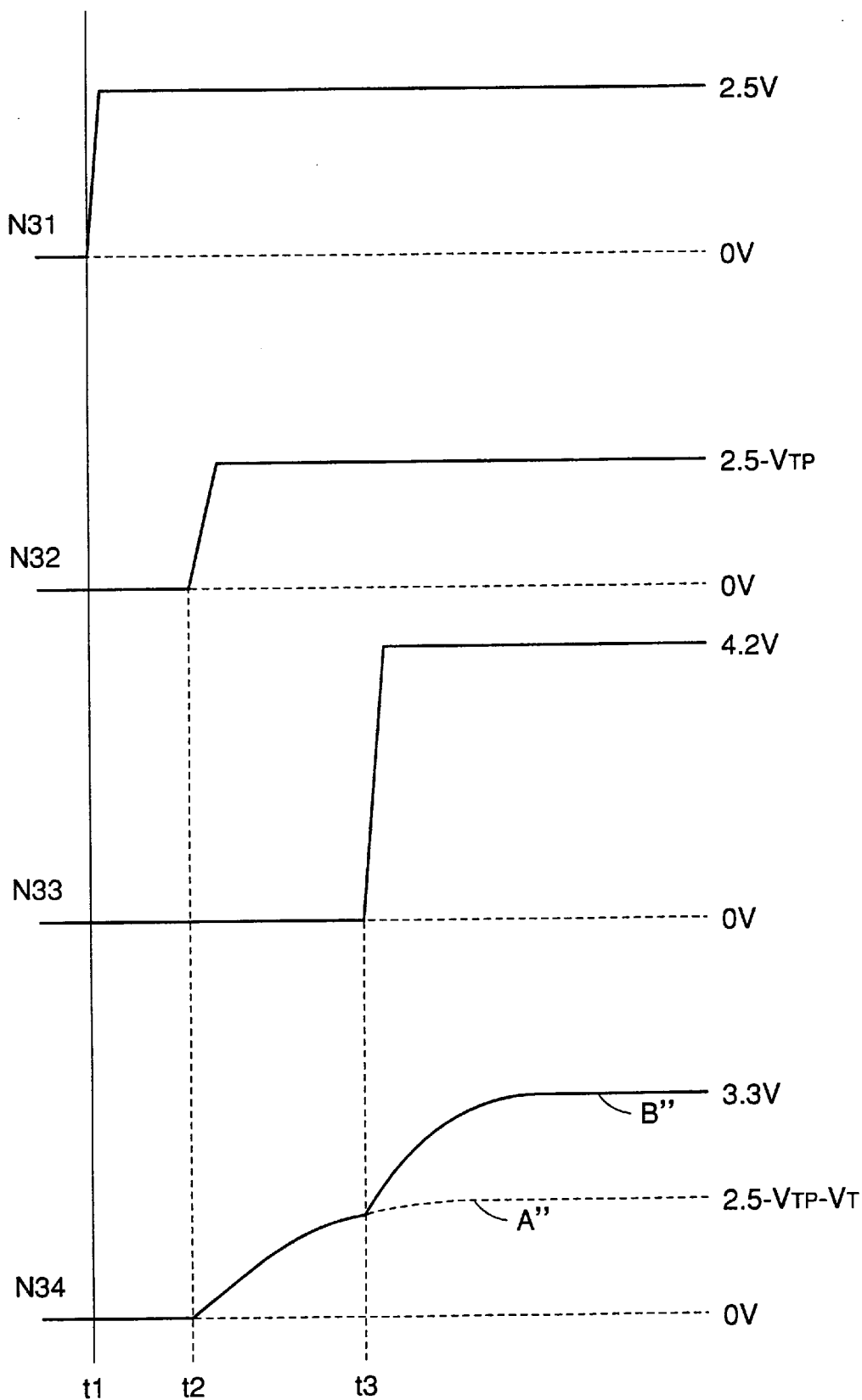
FIG. 10 is a diagram of operation waveforms, shown in conjunction with the operation of an output buffer 170 in FIG. 9.
Figure 11:
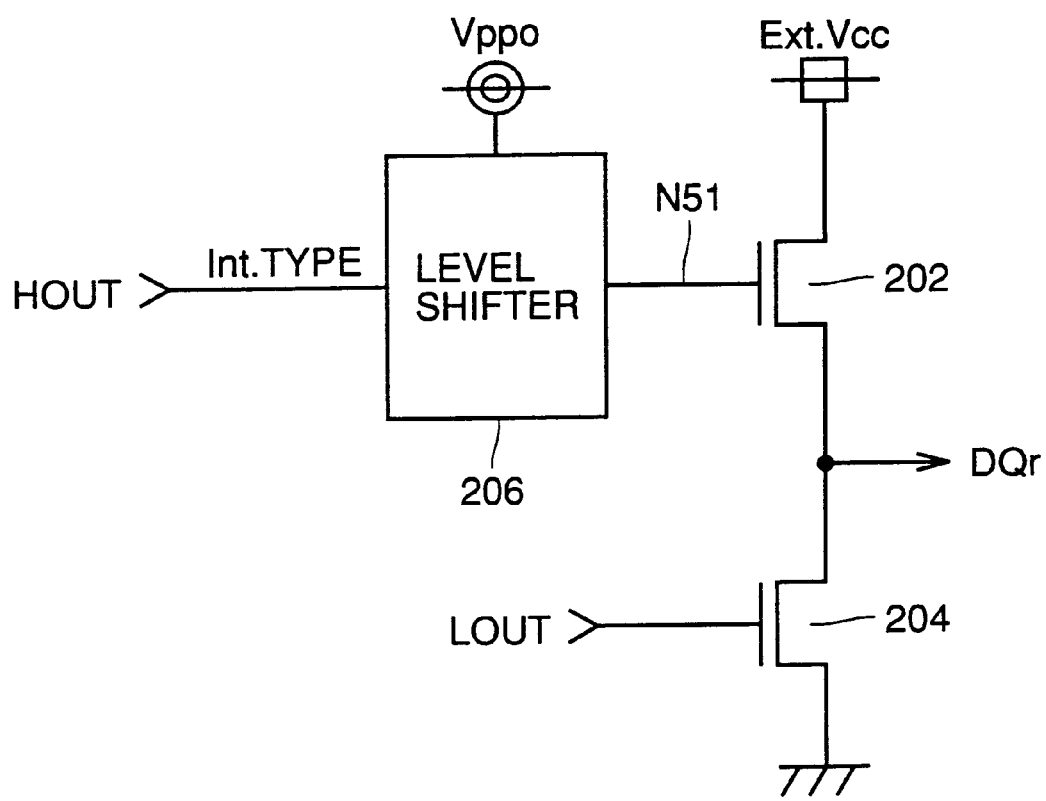
FIG. 11 is a circuit diagram showing an arrangement of a conventional output buffer circuit.
Figure 12:
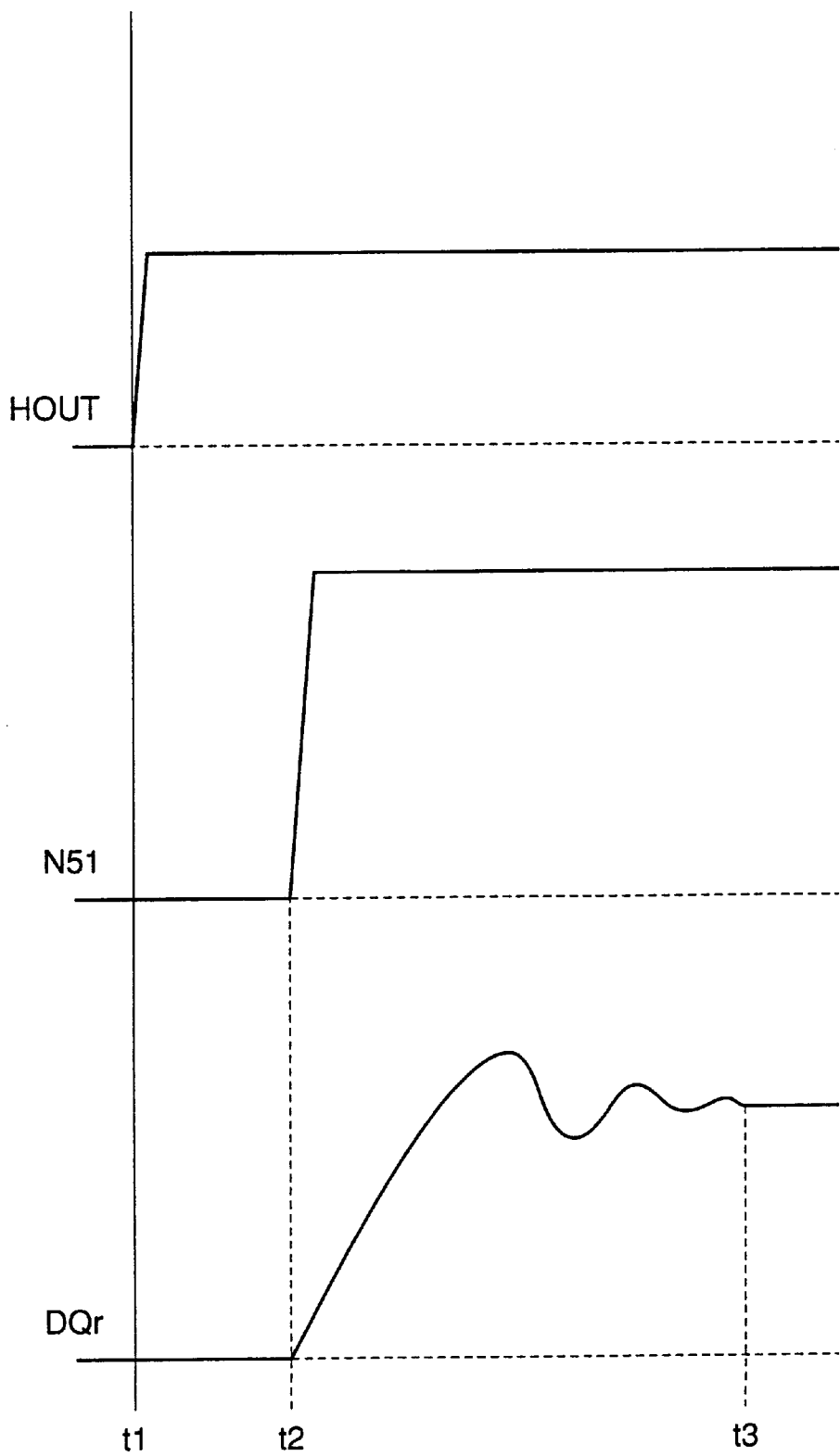
FIG. 12 is a diagram of operation waveforms shown in conjunction with the operation of the output buffer circuit in FIG. 11.
Figure 13:
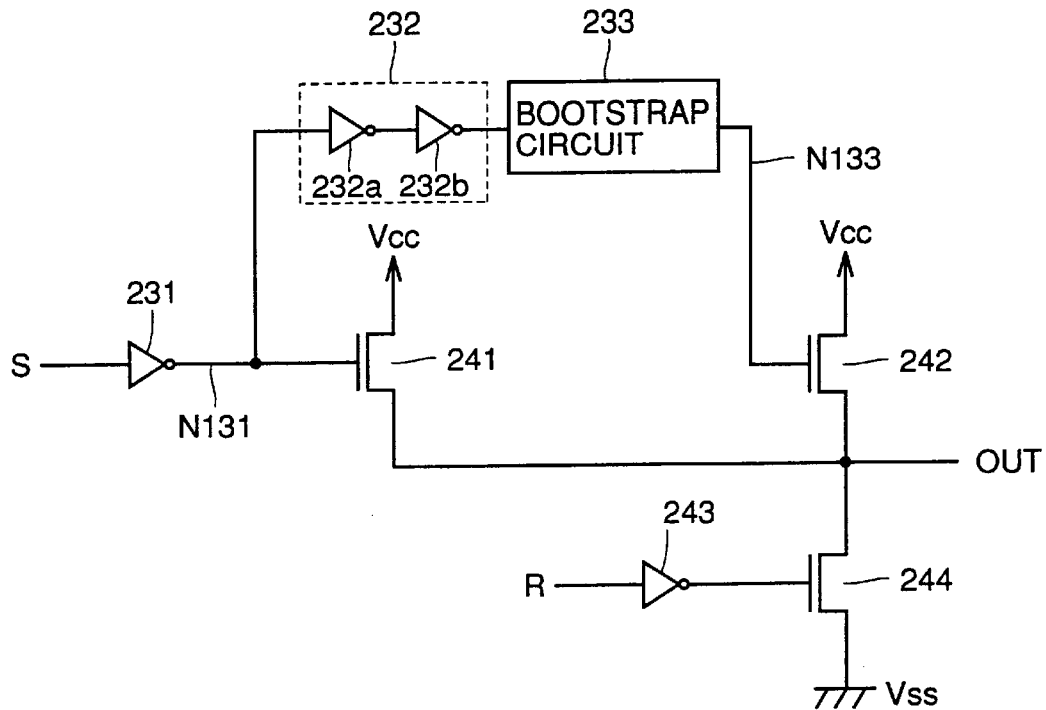
FIG. 13 is a circuit diagram showing a second exemplary arrangement of the conventional output buffer circuit.
Figure 14:
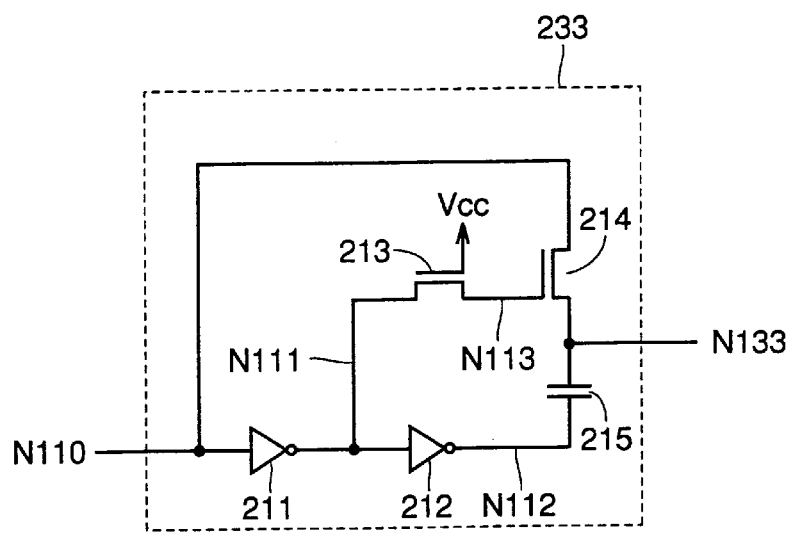
FIG. 14 is a circuit diagram showing an arrangement of a bootstrap circuit 233 in FIG. 13.

Referring to FIGS. 9 and 10, the case where second internal control signal LOUT is in the L state will now be considered. Then, N channel MOS transistor 176 is in the non-conductive state.

Assuming that the level at output terminal DQr is initially 0V, first internal control signal HOUT is at the L level and the potentials at nodes N32 and N33 are also at the L level, so that N channel MOS transistors 172 and 174 are both in the non-conductive state.

At t1, first internal control signal HOUT applied to node N1 rises from 0V to internal down-converted potential Vcc (for example of 2.5V).

At t2, the potential of node N32 attains to the H level in response to first internal control signal HOUT, which has been inverted by the inverter formed of P channel MOS transistor 182 and N channel MOS transistor 184. The potential of node N32 is further decreased from internal down-converted potential Vcc by the threshold value Vtp of P channel MOS transistor 186.

Between t2 and t3, N channel MOS transistor 174 is brought into the conductive state. As is apparent from a waveform A" in FIG. 10, the potential at output terminal DQr begins to rise toward the potential of (2V-Vtp-Vt).

At t3, voltage conversion through delay circuit 178 and level shifter 180 is completed, and N channel MOS transistor 172 is brought into the conductive state. As is apparent from a waveform B" in FIG. 10, the potential at DQr begins to rise toward external power supply potential Ext.Vcc (of 3.3V).

With the arrangement, the gate potential of N channel MOS transistor 174, which first becomes conductive, is further decreased, so that the amount of current flowing into the transistor, which becomes conductive at the start of the rising of the output, is further reduced as compared with the case for the first embodiment. Therefore, further reduction in ringing is achieved as compared with the first embodiment.

As in the first embodiment, even when three or more driving transistors are provided in parallel on the H side, a similar effect can be obtained.

In addition, as in the second embodiment, the gate width of N channel MOS transistor 174 may be set smaller than that of N channel MOS transistor 172 to achieve a greater effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device formed on a semiconductor substrate, comprising:

an output terminal;

a first MOS transistor responsive to activation of a first internal control signal for supplying current to said output terminal from a power supply;

a first driving circuit responsive to the activation of said first internal control signal for outputting a second internal control signal having an activation potential higher than that of said first internal control signal;

a second MOS transistor having its gate receiving said second internal control signal and responsive to activation of said second internal control signal for supplying current to said output terminal from said power supply;

a second driving circuit responsive to the activation of said first internal control signal for outputting a third internal control signal having an activation potential higher than that of said second internal control circuit after the activation of said second internal control signal; and a third MOS transistor having its gate receiving said third internal control signal and responsive to activation of said third internal control signal for supplying current to said output terminal from said power supply.

2. The semiconductor device according to claim 1, further comprising:

a boosting circuit receiving and boosting a potential of said power supply for generating an internal boosted potential higher than the potential of said power supply; and a down-converting circuit receiving and down-converting the potential of said power supply for generating an internal down-converted potential lower than the potential of said power supply, wherein an activation potential of said first internal control signal is said internal down-converted potential, the activation potential of said second internal control signal is the potential of said power supply, and the activation potential of said third internal control signal is said internal boosted potential.

3. The semiconductor device according to claim 2, wherein said first driving circuit includes a level converting circuit receiving said first internal control signal and the potential of said power supply and converting the potential of said second internal control signal to the potential of said power supply upon the activation of said first internal control signal.

4. The semiconductor device according to claim 1, wherein when a current drivability is defined as an amount of change in source/drain current per a unit change in a gate potential, the current drivability of said third MOS transistor is higher than that of said second MOS transistor, and the current drivability of said second MOS transistor is higher and that of said first MOS transistor.

5. The semiconductor device according to claim 4, wherein a magnitude of said current drivability is determined by changing a value of a gate width/a gate length of the MOS transistor.

6. The semiconductor device according to claim 1, wherein said second driving circuit includes a delay circuit for receiving and delaying by a prescribed period of time said first internal control signal.

7. A semiconductor device, comprising:

an output terminal;

a first MOS transistor responsive to activation of a first internal control signal for supplying current to said output terminal from a power supply;

a first driving circuit responsive to the activation of said first internal control signal for outputting a second internal control signal having an activation potential higher than that of said first internal control signal;

a second MOS transistor having its gate receiving said second internal control signal and responsive to activation of said second internal control signal for supplying current to said output terminal from said power supply;

a boosting circuit receiving and boosting a potential of said power supply for generating an internal boosted potential;

a down-converting circuit receiving and down-converting the potential of said power supply for generating an internal down-converted potential; and a second driving circuit receiving said first internal control signal for driving a gate potential of said first MOS transistor, wherein an activation potential of said first internal control signal is said internal down-converted potential, the activation potential of said second internal control signal is said internal boosted potential, and said second driving circuit includes a voltage decreasing circuit receiving and further down-converting said internal down-converted potential, and is responsive to a potential generated by said voltage decreasing circuit for driving a gate potential of said first MOS transistor.

8. The semiconductor device according to claim 7, wherein said voltage decreasing circuit includes an MOS transistor having a source receiving said internal down-converted potential, and a gate and a drain connected together.

9. The semiconductor device according to claim 1, further comprising switching circuit connected between said output terminal and a ground node, and responsive to a third internal control signal for driving a potential at said output terminal.

* * * * *